(12) United States Patent
Chilappagari et al.

(10) Patent No.: US 8,694,868 B1
(45) Date of Patent: Apr. 8, 2014

(54) SYSTEMS AND METHODS FOR PERFORMING MULTI-STATE BIT FLIPPING IN AN LDPC DECODER

(75) Inventors: Shashi Kiran Chilappagari, San Jose, CA (US); Nedeljko Varnica, San Jose, CA (US); Xueshi Yang, Cupertino, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 166 days.

(21) Appl. No.: 13/300,323

(22) Filed: Nov. 18, 2011

Related U.S. Application Data

(63) Continuation-in-part of application No. 13/276,525, filed on Oct. 19, 2011.

(60) Provisional application No. 61/405,310, filed on Oct. 21, 2010, provisional application No. 61/415,763, filed on Nov. 19, 2010.

(51) Int. Cl.
*H03M 13/00* (2006.01)
(52) U.S. Cl.
USPC ............ 714/774; 714/752; 714/755; 714/758

(58) Field of Classification Search
USPC .................. 714/752, 755, 758, 774
See application file for complete search history.

(56) References Cited

U.S. PATENT DOCUMENTS

2008/0148128 A1* 6/2008 Sharon et al. ................. 714/758
2010/0269011 A1 10/2010 Oh et al.

* cited by examiner

*Primary Examiner* — Sam Rizk

(57) ABSTRACT

Systems and methods are provided for decoding data using hard decisions and soft information. In particular, the systems and methods described herein are directed to decoders having variable nodes and check nodes, each with multiple states. The systems and methods include receiving, at a decoder during a first iteration, values for each of a plurality of variable nodes, and determining, during a second iteration, one or more indications for each of a plurality of check nodes based on the one or more values of the variable nodes received during the first iteration. The methods further include updating, at the decoder during the second iteration, the values for each of the variable nodes based on the values of the respective variable node received during the first iteration, and the indications for each of the plurality connected check nodes during the first iteration.

20 Claims, 10 Drawing Sheets

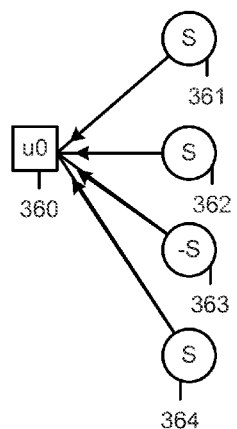
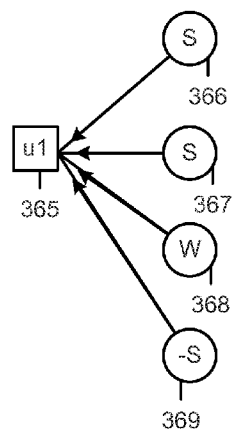
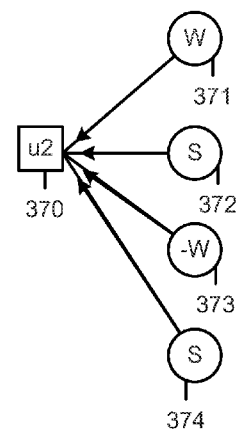
Figure 3G　　　　　　　Figure 3H　　　　　　　Figure 3I
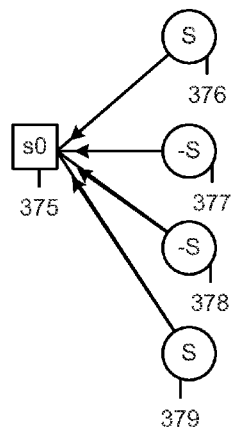
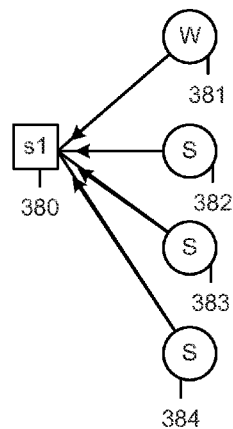
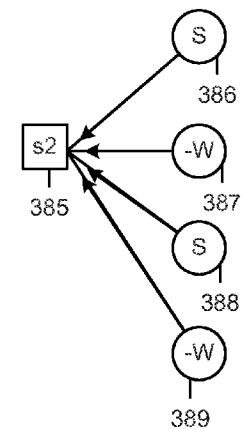
Figure 3J　　　　　　　Figure 3K　　　　　　　Figure 3L Threshold to assign = 2
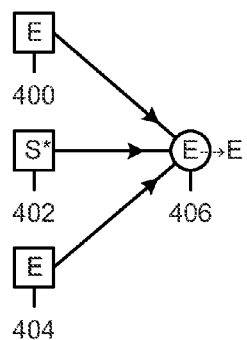
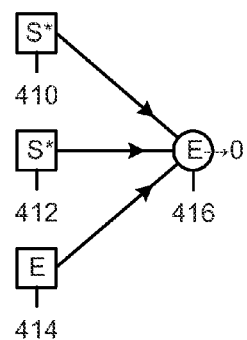
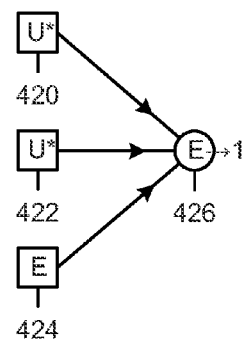
Figure 4A Figure 4B Figure 4C
Threshold to toggle = 2
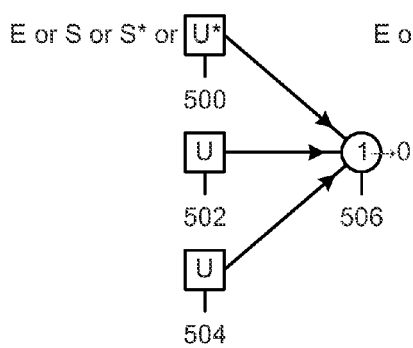
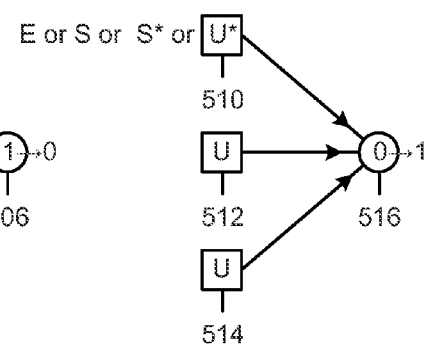
Figure 5A Figure 5B

SYSTEMS AND METHODS FOR PERFORMING MULTI-STATE BIT FLIPPING IN AN LDPC DECODER

CROSS REFERENCE TO RELATED APPLICATION

This application is a continuation-in-part of U.S. patent application Ser. No. 13/276,525, filed Oct. 19, 2011, which claims the benefit under 35 U.S.C. §119(e) of U.S. Provisional Application No. 61/405,310, filed Oct. 21, 2010, and this application claims the benefit under 35 U.S.C. §119(e) of U.S. Provisional Application No. 61/415,763, filed Nov. 19, 2010, which are hereby incorporated by reference herein in their entirety.

FIELD OF THE INVENTION

The present disclosure relates generally to data decoding for data encoded with a low density parity check (LDPC) encoder.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

LDPC codes and decoders that are used to decode LDPC codes may be used in numerous applications and devices. For example, data storage, satellite communications, wireless communications, wire-line communications, and power-line communications are applications that may each use LDPC codes and LDPC decoders. Devices such as digital camera flash memory storage, satellites, mobile phones, and other mobile devices may also each use LDPC codes and LDPC decoders.

LDPC codes may be used for correcting errors in information transmitted in a noisy communications or data storage channel. The information may be encoded (by a LDPC encoder) prior to transmission and then subsequently decoded (by a LDPC decoder) when received. The performance capability of an LDPC coding scheme is often described by the code's performance curve. The performance curve is a plot of signal-to-noise ratios (SNRs) vs. Bit Error Rate (BER), or equivalently Sector Error Rate (SER). LDPC codes are one of the best performing error correcting codes, along with Turbo codes, for use in correcting errors in information transmitted on communication and data storage channels.

Previous LDPC hard decision algorithms are typically two-state systems, in which bits in an incoming code are assigned to one of two binary states. Improved decoding results can be achieved using soft information, such as probability distributions. However, storing and processing soft information can be very demanding on processor and memory resources.

SUMMARY

The present disclosure relates to a method for decoding data using multi-state bit flipping decoders. In particular, the systems and methods described herein are directed to decoders having variable nodes and check nodes with multiple states. The systems and methods may include providing decoder circuitry in communication with a plurality of variable nodes and a plurality of check nodes, wherein each of the variable node is connected to a plurality of check nodes, and each of the check nodes is connected to a plurality of variable nodes. The methods may include receiving, at the decoder circuitry during a first iteration, one or more values of each of the plurality of variable nodes, and determining, at the decoder circuitry during a second iteration, one or more indications for each of the plurality of check nodes based on the one or more values of the connected variable nodes received during the first iteration. The methods may further include updating, at the decoder circuitry during the second iteration, the one or more values of each of the variable nodes based on the one or more values of the respective variable node received during the first iteration, and the one or more indications for each of the plurality connected check nodes during the first iteration. In certain arrangements, the one or more values of each of the plurality variable nodes is selected from a group consisting of at least three values, and wherein the one or more indication of each of the plurality of check nodes is selected from a group consisting of at least three indications.

In certain implementations, the methods may further comprise repeating the operation of determining an indication for each of the plurality of check nodes, and updating the value of each of the variable nodes until a completion condition is reached. In certain implementations, the value of each of the plurality of variable nodes is a two bit value and is selected from a group consisting of 00, 01, 10, 11, wherein the at least one of the first bit and second bit is a sign bit representative of the data being decoded and the other bit is a reliability bit representative of the reliability of the data being decoded.

BRIEF DESCRIPTION OF THE DRAWINGS

The above and other features of the present disclosure, including its nature and its various advantages, will be more apparent upon consideration of the following detailed description, taken in conjunction with the accompanying drawings in which:

FIGS. 3G through 3L show graphical illustrations of an rule for determining an indication of a check node based on messages received from variable nodes having four states in accordance with some arrangements;

FIGS. 4A through 4C show graphical illustrations of rules for determining a value of a variable node having one of three-states, based on indications received from check nodes in accordance with some arrangements;

FIGS. 5A and 5B show graphical illustrations of rules for toggling the value of a variable node having one of three-states, based on indications received from check nodes in accordance with some arrangements;

DETAILED DESCRIPTION

Figure 1A:
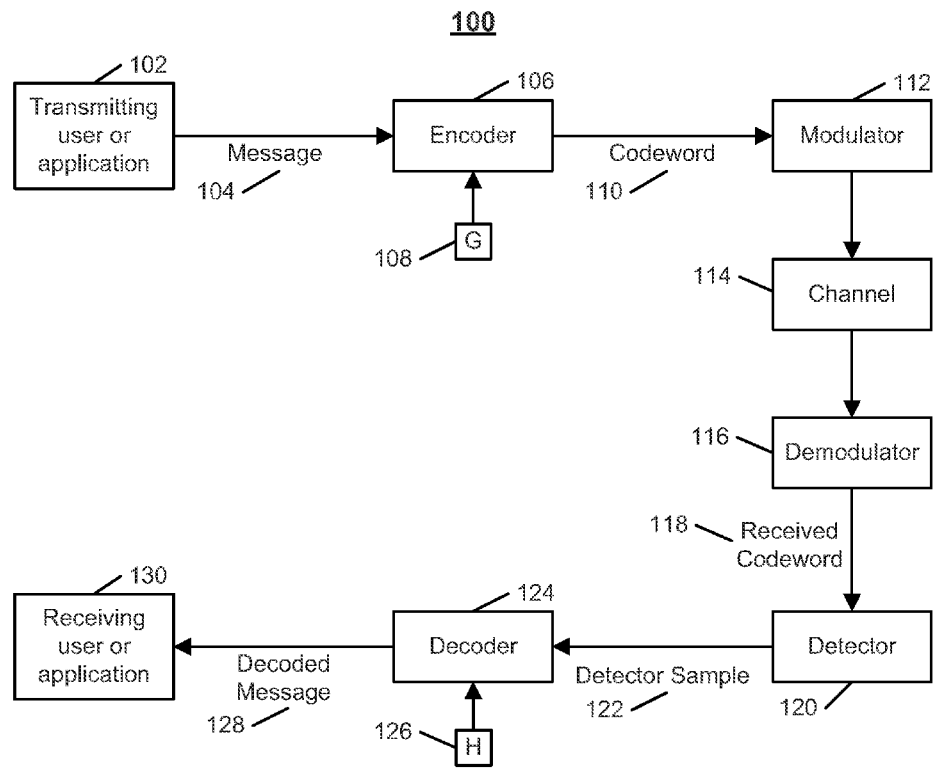
FIG. 1A shows an example of a communications system employing LDPC decoding.

FIG. 1A shows an illustrative communications system employing LDPC decoding techniques utilizing soft information such as erasure and reliability information. A communications system 100 is used to transmit information from a transmitting user or application 102 to a receiving user or application 130. The transmitting user or application 102 represents an object or entity that produces information. For example, the transmitting user or application 102 may correspond to a software program in a computer system or to a component of a wireless communications transmitter in a radio system. The transmitting user or application 102 produces information in the form of a data stream, and the data stream may be represented by a sequence of symbol values that have been pre-processed by, for example, a source encoder (not shown in FIG. 1A). The information produced by the transmitting user or application 102 may correspond to voice information, video information, financial information, or any other type of information that may be represented in digital or analog form, and the data stream produced by transmitting user or application 102 may be, a digital data stream.

The transmitting user or application 102 may segment or otherwise divide the data stream into blocks of a fixed length of k symbols. In particular, a message 104, also referred to as m, represents one of these blocks. In particular, the message 104 is k symbols in length, where each symbol may be binary data, ternary data, quaternary data, any other suitable type of data, or any suitable combination thereof. An encoder 106 is used to encode the message 104 to produce a codeword 110. In a preferred arrangement, the encoder 106 is an LDPC encoder. However, based on the disclosure and teachings provided herein, it should be clear that the encoder 106 may be a turbo encoder or any other suitable encoder. The codeword 110, also referred to as c, has a length of n symbols, where n>k. The encoder 106 uses a generator matrix G 108, also referred to as G for notational convenience, to produce the codeword 110. For example, the encoder 106 may perform one or more matrix operations to convert the message 104 into the codeword 110. In an arrangement, the encoder 106 produces the codeword 110 from the message 104 using the generator matrix G 108 by the following matrix multiplication $$\underline{c} = G\underline{m}.$$

The codeword 110 may be modulated or otherwise transformed by a modulator 112 into a waveform suitable for transmission and/or storage on a channel 114. For example, the waveform may correspond to an analog Binary Phase-Shift Keying (BPSK) signal, analog Phase-Shift Keying (PSK) signal, analog Frequency-Shift Keying (FSK) signal, analog Quadrature Amplitude Modulation (QAM) signal, or any other suitable analog or digital signal.

The channel 114 refers to the physical medium through which the transmitted waveform passes or is stored on before being recovered at a demodulator 116. For example, the channel 114 may be a storage channel that represents a magnetic recording medium in a computer system environment or a communications channel that represents the wireless propagation environment in a wireless communications environment. Various characteristics of the channel 114 may corrupt data that is communicated or stored thereon. For example, the channel 114 may be a non-ideal memoryless channel or a channel with memory. The output of the channel 114 is demodulated and processed by the demodulator 116 to produce a received codeword 118. The demodulator 116 may use frequency filters, multiplication and integration by periodic functions, and/or any other suitable demodulation technique to demodulate and/or process the output of the channel 114.

The received codeword 118 contains information related to the codeword 110 and generally corresponds to a corrupted or otherwise altered version of the codeword 110 originally output by the encoder 106. For example, the received codeword 118 may contain a preliminary estimate or noisy version of the codeword 110, a probability distribution vector of possible values of the codeword produced by the encoder 106, or combinations of these as well other values.

A detector 120 is used to process the received codewords 118 to produce a detector sample 122, which is an estimate of the original data message 104. The detector 120 samples each symbol in the received codeword 118 and assigns each symbol to a bin based on its value. In some arrangements, the bin is assigned based on a probability distribution. In certain embodiments, each symbol sampled by the detector 120 is assigned to one of three or more possible bins, or states. Rules for assigning the symbols into one of three bins or states (0, 1, and erasure states) are described in relation to FIG. 1B. Rules for assigning the symbols into one of four bins or states (S, W, −S and −W) are described in relation to FIG. 1C, where the letters S or W indicate the reliability of the bits—strong or weak—and the sign relates to its value—0 or 1.

A decoder 124 receives and iteratively processes the detector sample 122. The detector 120 and the decoder 124 may be two separate processors, or a single processor may be used as both the detector 120 and decoder 124. In general, the decoder 124 comprises control circuitry used to iteratively detect and/or correct errors present in the detector sample 122, for example, due to transmission through the channel 114. In an arrangement, the decoder 124 uses the parity check matrix H 126 and a decoding algorithm to produce a decoded message 128. In general, LDPC decoding can be described using a mathematical vector model $H\underline{c} = \vec{0}$, in which c is a binary string of length n and H is the parity check matrix H 126, which is a low-density, sparse n×k matrix, wherein, as above, n is the number of symbols in the codeword and k is the number of symbols in the message. The model, is satisfied only when the binary string c is the codeword c 110. The parity check matrix H 126 is not necessarily unique, and may be chosen to be computationally convenient and/or to decrease the number of errors generated by the decoding algorithm of the decoder 124.

The iterative decoding algorithm used by the decoder 124 involves processing a detector sample 122 in which each symbol is assigned as one of three or more input states (e.g., two strong binary states plus two weak binary states). After processing, each symbol in the decoded message 128 is assigned as one of two strong binary states. When input into the model $H\vec{c}=\vec{0}$ as c, the decoded message 128 satisfies the model. Suitable algorithms for performing the decoding are described in relation to FIG. 2A through FIG. 8.

The decoded message 128 is delivered to the receiving user or application 130 after being processed by the decoder 124. The receiving user or application 130 may correspond to the same device or entity as the transmitting user or application 102, or the receiving user or application 130 may correspond to a different device or entity. Further, the receiving user or application 130 may be either co-located or physically separated from the transmitting user or application 102. If the decoder 124 corrects all errors that are induced by the channel 114 and other communications effects in the communications system 100, then the decoded message 126 is a logical replica of the message 104. Otherwise, the decoded message 126 may differ from the message 104, and the decoder 124 may declare an error accordingly.

Figure 1B:
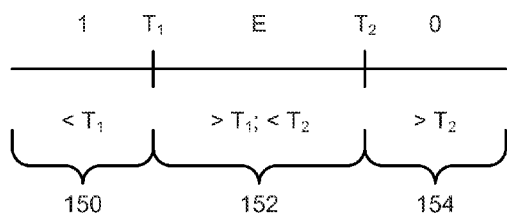
FIG. 1B shows an example of rules for assigning hard decisions and erasures at the detector of FIG. 1A.
Figure 1C:
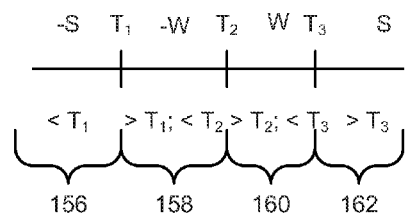
FIG. 1C shows an example of rules for assigning hard decisions and other soft, reliability-based information at the detector of FIG. 1A.

FIGS. 1B and 1C show an illustration of rules for assigning states at the detector. In particular, FIG. 1B shows an illustration of rules for assigning hard decisions and erasures at the detector of FIG. 1A in accordance with some arrangements. The detector 120 accesses each symbol of the received codeword 118 stored in memory to store an input state of each symbol. In FIG. 1B, three input states are shown: 1, E (e.g., "erased"), and 0. To determine the input state of a given symbol, the memory cell in which the received value of the symbol is stored is read once or twice. First, the decoder 124 reads the memory cell and compares the charge stored in that cell to a first threshold $T_1$. If the stored charge is less than $T_1$, the stored charge of the symbol falls into the leftmost region 150 and the detector 120 stores a value of 1 as the input state of that symbol. If the charge is greater than $T_1$, the detector 120 reads the memory cell a second time and compares the stored charge to a second threshold $T_2$. If the stored charge is greater than $T_2$, the stored charge of the symbol falls into the rightmost region 154 and the detector 120 stores a value of 0 as the input state of that symbol. Otherwise, it is determined that the stored charge is between $T_1$ and $T_2$; the symbol then falls into the middle region 152 and the detector 120 stores the input state of that symbol as "erased" or E. The input states determined for the detector sample 122 are stored in memory as variable nodes of the sampled codeword. This memory is termed the "hard decision memory", which may be in a different memory location from the received codeword 118.

In some arrangements, each symbol is assigned to one of more than three states. For example, there may be one or more thresholds between $T_1$ and $T_2$, and the erased state may be separated into "high erase" and "low erase" states; "high erase", "middle erase", and "low erase" states; and so forth. In certain embodiments, it is desirable for the decoder 124 to assign binary values (0 or 1) to symbols initially assigned to an erase state. In general, if the thresholds cause too many symbols to be erased, the algorithm may not be able to efficiently or accurately assign values to all of the erased symbols. On the other hand, if too few symbols are erased, the original assignments of the symbols may be too error prone and hinder the decoder 124. Thus, the two or more thresholds may be optimized based on the received codeword 118.

In certain arrangements, each symbol is assigned to one of four states. FIG. 10 shows an example of rules for assigning hard decisions and other soft, reliability-based information at the detector of FIG. 1A. The detector 120 accesses each symbol of the received codeword 118 stored in memory to store an input state of each symbol. In FIG. 10, four input states are shown: S (strong "0"), W (weak "0"), −S (strong "1") and −W (weak "1"). To determine the input state of a given symbol, the memory cell in which the received value of the symbol is stored is read thrice. First, the decoder 124 reads the memory cell and compares the charge stored in that cell to a first threshold $T_1$. If the stored charge is less than $T_1$, the stored charge of the symbol falls into the leftmost region 156 and the detector 120 stores a value of 1 as the input state of that symbol. Being in the leftmost region 156, the detector 120 also stores the soft information that the value of 1 is a "strong" value. If the charge is greater than $T_1$, the detector 120 reads the memory cell a second time and compares the stored charge to a second threshold $T_3$. If the stored charge is greater than $T_3$, the stored charge of the symbol falls into the rightmost region 162 and the detector 120 stores a value of 0 as the input state of that symbol. Being in the rightmost region 162, the detector 120 also stores the soft information that the value of 0 is a "strong" value.

Otherwise, it is determined that the stored charge is between $T_1$ and $T_3$; and the detector 120 reads the memory cell a third time and compares the stored charge to a third threshold $T_2$. If the stored charge is then less than $T_2$, the stored charge of the symbol falls into the near-left region 158 and the detector 120 stores a value of 1 as the input state of that symbol. However, being in the near-left region 158, the detector 120 also stores the soft information that the value of 1 is a "weak" value. If the stored charge is then greater than $T_2$, the stored charge of the symbol falls into the near-right region 160 and the detector 120 stores a value of 0 as the input state of that symbol. However, being in the near-right region 160, the detector 120 also stores the soft information that the value of 0 is a "weak" value. In certain embodiments, the input states determined for the detector sample 122 are stored in memory as variable nodes of the sampled codeword. This memory is termed the "hard decision memory", which may be in a different memory location from the received codeword 118.

Each symbol may be assigned to any number of suitable states, and the detector 120 may be configured to perform any suitable number of memory reads for determining the state of a symbol.

Figure 2A:
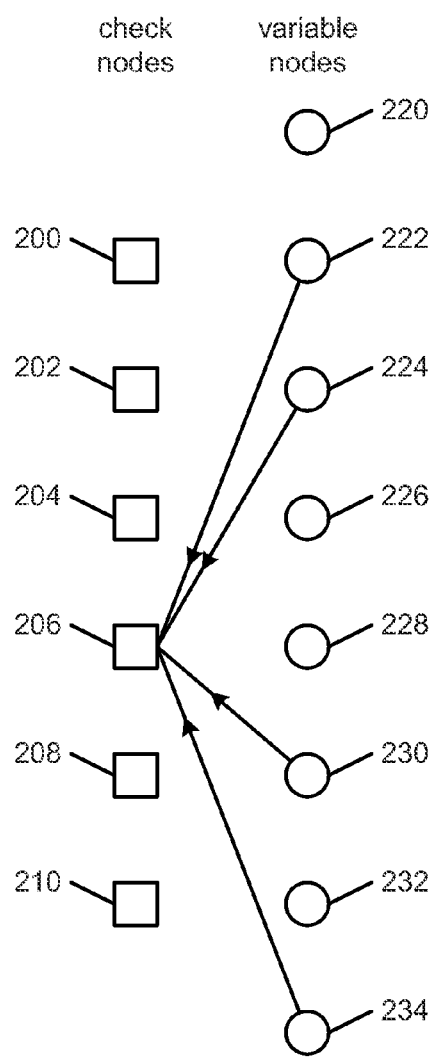
FIGS. 2A and 2B show a graphical illustration of communications between variable nodes representing a codeword and check nodes for decoding the codeword in accordance with some arrangements.
Figure 2B:
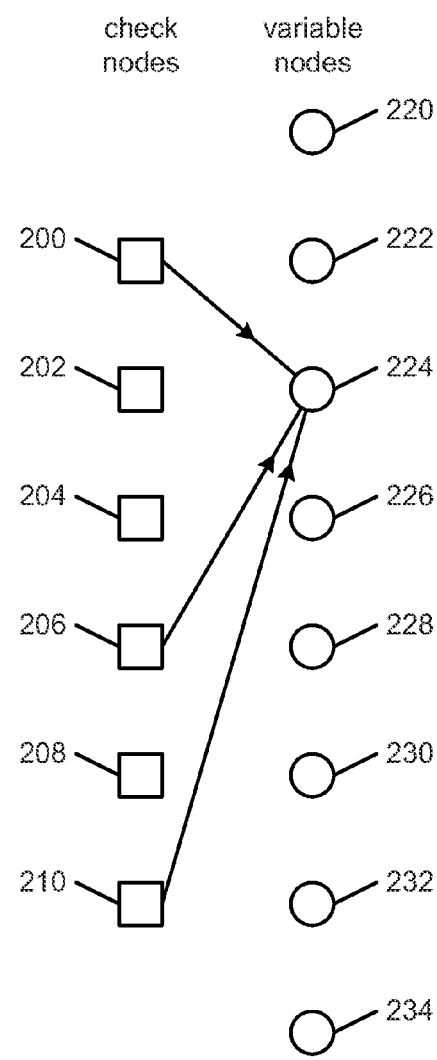
Figure 2C:
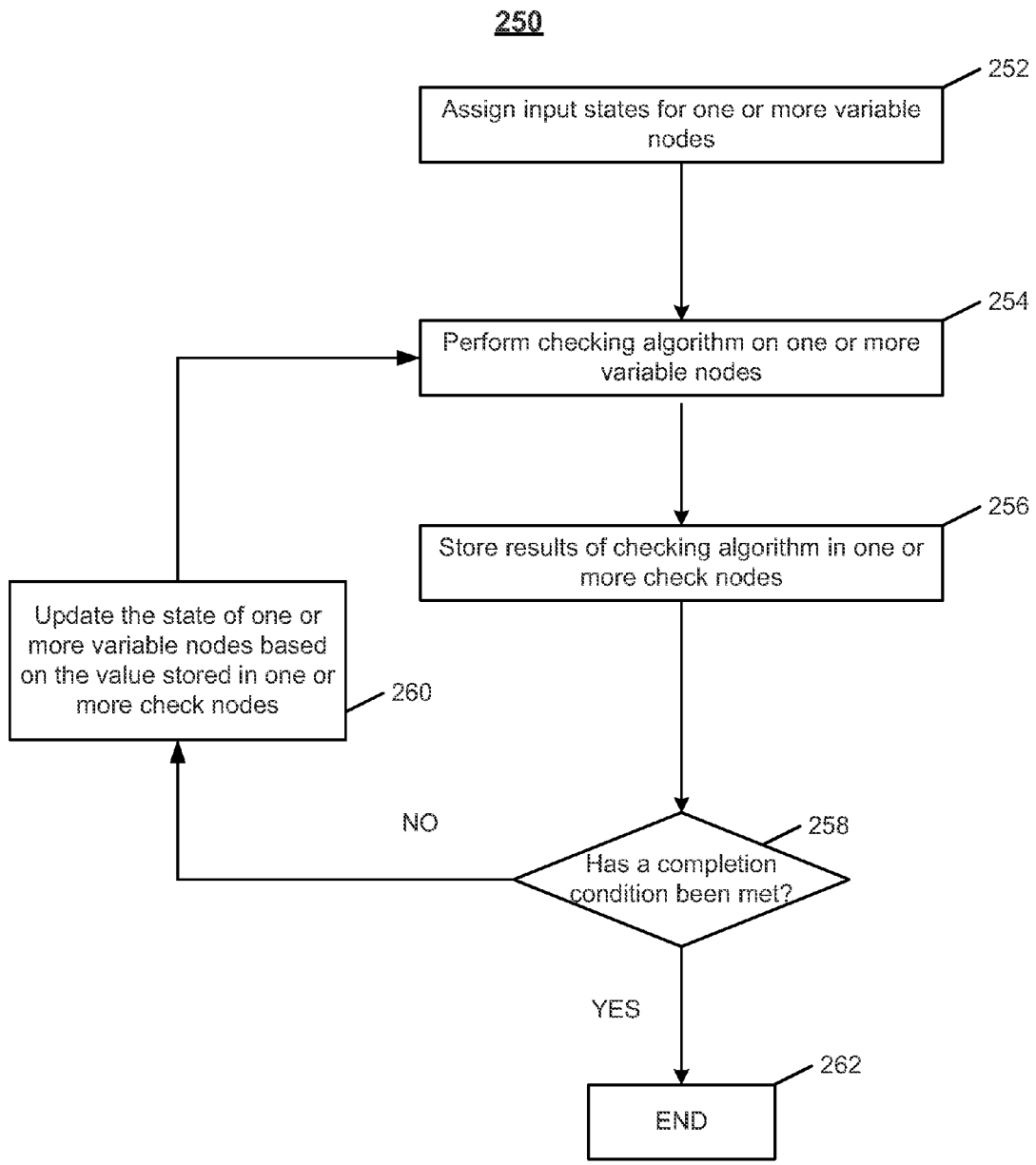
FIG. 2C shows a flow chart for a method for generally decoding a codeword at the detector of FIG. 1A in accordance with some arrangements.

FIGS. 2A and 2B show a graphical illustration of communications between variable nodes 220-234 representing a sampled codeword and check nodes 200-210 for decoding the codeword in accordance with some arrangements. FIG. 2C shows a flow chart, in connection with FIGS. 2A and 2B, for a method 250 for generally decoding a codeword at the detector of FIG. 1A.

After the variable nodes 220-234 are assigned input states or values using the detector 120 as described above in relation to FIG. 1B (at 252), a check of the variable nodes is performed by the detector 124 on a plurality of groups of variable nodes (at 254). The detector 124 uses a check algorithm to determine if given conditions for a group of variable nodes are met. The result of the check is stored in syndrome memory at a check node, such as check nodes 200-210 (at 256). The parity check matrix H 126 (FIG. 1) identifies which check nodes store indications of the results of the check for which variable nodes. For example, for the nodes pictured in FIGS. 2A and 2B, the parity check matrix H 126 may be as follows:

$$H = \begin{bmatrix} 1 & 0 & 1 & 0 & 1 & 1 & 0 & 0 \\ 0 & 1 & 0 & 1 & 0 & 1 & 1 & 0 \\ 1 & 0 & 0 & 1 & 1 & 0 & 1 & 0 \\ 0 & 1 & 1 & 0 & 0 & 1 & 0 & 1 \\ 0 & 1 & 0 & 0 & 1 & 0 & 1 & 1 \\ 1 & 0 & 1 & 1 & 0 & 0 & 0 & 1 \end{bmatrix}$$

Each row corresponds to one of the check nodes, and each column corresponds to one of the variable nodes. The decoder 124 references the parity check matrix H 126 to identify which variable nodes should be checked by a particular check node. For example, for the variable node 206, the decoder 124 determines that variable node 206 (represented by the fourth row) stores the result of a check of variable nodes 222, 224, 230, and 232 (i.e., the second, third, sixth, and eighth variable nodes). Then, the decoder 124 retrieves the values stored in these variable nodes. For illustration, the arrows in FIG. 2A indicate that the retrieved values flow from the variable nodes 222, 224, 230, and 232 to the check node 206, and the check node 206 may be considered to "check" the variable nodes 222, 224, 226, and 228. In reality, the variable node values are retrieved by the decoder 124, which processes the values on behalf of the check node 206. From the values received from the variable nodes 222, 224, 230, and 232, the decoder 124 determines whether a given condition for the check node 206 is satisfied or is unsatisfied. In some cases, as will be discussed in reference to FIG. 3A, the processor receives too many values of "erased" from the variable nodes and does not identify whether or not the condition of the check node 206 is satisfied. In some cases, as will be discussed in reference to FIGS. 3I and 3L, the processor receives too many "weak" values from the variable nodes and does not identify with confidence whether or not the condition of the check node 206 is satisfied. An indication of whether the check node 206 is satisfied, unsatisfied, or undetermined (i.e., the "syndrome value" of the check node) is stored in syndrome memory, which stores syndrome values or indications of the check nodes. Rules for determining the indications of the check nodes for variable nodes having one of three states are discussed in relation to FIGS. 3A through 3F. Rules for determining the indications of the check nodes for variable nodes having one of four states are discussed in relation to FIGS. 3G through 3L.

After the indications or syndrome values for the check nodes 200-210 have been determined and stored in the syndrome memory, the values of the variable nodes 220-234 are updated based on the values of the check nodes (step 260). The parity check matrix H 126 is again used by the decoder 124 to determine which check nodes should be accessed for a particular variable node. As illustrated in FIG. 2B, for updating the variable node 224, the parity check matrix H 126 given above indicates that check nodes 200, 206, and 210 (i.e., the first, fourth, and sixth variable nodes) should be referenced. Based on the indications of the referenced check nodes, the state of the variable node 224 (e.g., S, W, −S or −W) may be updated. Rules for determining updated values of variable nodes having one of three states are discussed in detail in relation to FIGS. 4A through 5B. Rules for determining updated values of variable nodes having one of four states are discussed in detail in relation to FIGS. 6A through 6C.

Since the value of each variable node is assigned to one of three, four or more states, two or more bits may be used to store each assigned state. For example, three-state input typically requires two-bit storage. However, since two bits can store up to four states, storing the value of each variable node in two dedicated bits for a three-state system is not memory efficient. The storage can be reduced using a memory-combine approach wherein multiple hard decision memory cells for storing variable nodes are combined into blocks. In general, the assigned states of $G_v$ variable nodes each having N possible states can be described by a minimum of $N^{G_v}$ different values. For example, if the values of three variable nodes each assigned to one of three states are stored together in a single block, the values of the variable nodes in the block can be described by one of $3^3=27$ values. The number of bits needed to store 27 different values, then, is $\log_2(27)=4.755>5$. The efficiency in this case is 5 bits÷3 variable nodes=1.6667 bits/node. This is superior to the 2 bits/node that would be required without memory combining.

For greater efficiency in the three-state example, if the block size is five nodes rather than three nodes, the values of the variable nodes in the block can be described by one of $5^3=243$ values. The number of bits needed to store 243 different values is $\log_2(243)=7.928<8$. The efficiency in this case is 8 bits÷5 variable nodes=1.6 bits/node.

Similarly, check nodes stored in syndrome memory can be combined. In various arrangements, the check nodes can be one of three states, four states, five states, or other number of states. If the number of possible states is not a power of two, for memory efficiency, the check nodes can be grouped into blocks and combined, as described above.

FIGS. 3A-3L show graphical illustrations of rules for determining indications of check results to be stored in check nodes based on messages received from variable nodes. In particular, FIG. 3A and FIGS. 3C through 3F show graphical illustrations of rules for determining indications at check node based on from the value of variable nodes having one of three states. FIGS. 3G through 3L show graphical illustrations of rules for determining indications at check nodes based on the value of variable nodes having one of four states.

Generally, the indications at check nodes may be any suitable function of the value of neighboring variable nodes $$S_i(c)=f_i(S_{i-1}(N(c)))$$

Where $S_i(c)$ is indication at the check nodes after the $i^{th}$ iteration of the decoding algorithm, $S_{i-1}(N(c))$ is the value of the neighboring variable nodes at the $(i-1)^{th}$ iteration, and $f_i$ is the respective function at the $i^{th}$ iteration. In certain embodiments, the function f is constant across all iterations. In other embodiments, the function f varies across one or more iterations.

Figure 3A:
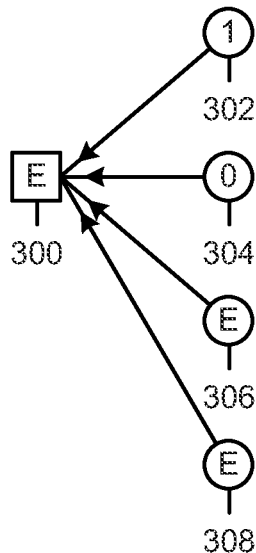
FIGS. 3A, and 3C through 3F show graphical illustrations of rules for determining an indication of a check node, based on messages received from variable nodes having three states in accordance with some arrangements.

In certain arrangements, the check nodes may not have sufficient information to determine an indication. For example, in FIG. 3A, the decoder 124 is determining whether a check node 300 is satisfied. The decoder 124 (acting on behalf of the check node 300) receives values 1, 0, E ("erased"), and E from variable nodes 302, 304, 306, and 308, respectively. In this case, the decoder 124 determines that, having received two binary values and two "erased" values, it does not have enough information to determine whether a condition for the check node 300 is satisfied. So, in this case, a check is not performed. The check node 300 is assigned a value of "E" (for "Erasures"), as shown in FIG. 3A, which indicates that at least a threshold number of the variable nodes that the check node 300 receives values from are set to "erased". In this case, the threshold number of erased variable nodes that trigger an indication of "E" is two. However, the threshold number of erased variable nodes that trigger an indication of "E" can be different, and can vary from iteration to iteration.

Figure 3B:
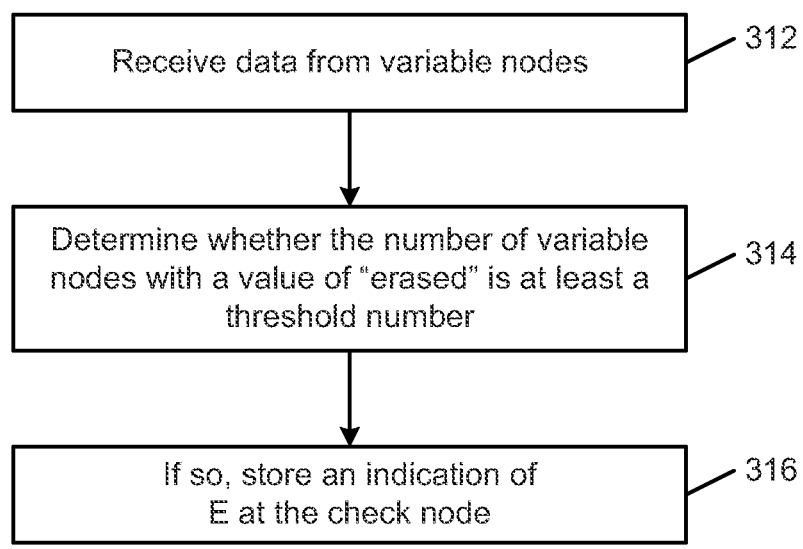
FIG. 3B shows a flow chart for an method of applying the rule shown in FIG. 3A in accordance with some arrangements.

A method for setting the check node 300 to E is shown in FIG. 3B. At 312, the decoder 124, which may be control circuitry such as a processor, receives data from the variable nodes 302-308, which are stored in hard decision memory. At 314, the decoder 124 determines whether the number of variable nodes 302-308 with a value of "erased" is at least a threshold number of erased variable nodes. At 316, upon a determination that the number of variable nodes 302-308 with a value of "erased" (two in this case) is at least the threshold (two in this case), the decoder 124 stores an indication of "E" for the check node 300 in the syndrome memory. Rules applied when the number of "erased" variable nodes is less than the threshold are described in relation to FIGS. 3C through 3F. Similar methods can be used for applying these rules.

Figure 3C:
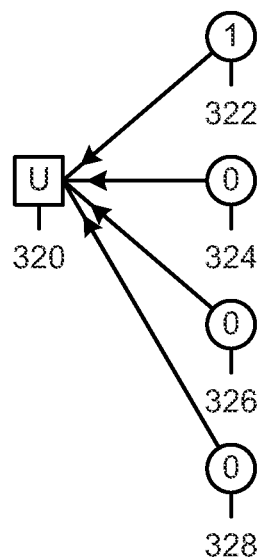
Figure 3D:
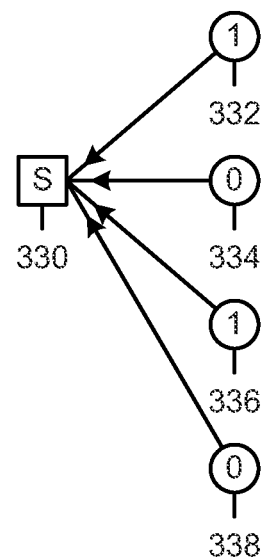

In FIG. 3D, the decoder 124 is determining whether a check node 320 is satisfied. The decoder 124 (acting on behalf of the check node 320) receives values of 1, 0, 0, and 0 from variable nodes 322, 324, 326, and 328, respectively. The decoder 124 processes the received values to determine whether a condition for the check node 320 is satisfied. For example, the decoder may XOR all of the received values. In this case, $1 \oplus 0 \oplus 1 \beta 0 = 0$, so the check is satisfied. Thus, the check node 320 is assigned a value of "S" (for "Satisfied"), as shown in FIG. 3D.

In FIG. 3C, the decoder 124 is determining whether a check node 330 is satisfied. The decoder 124 (acting on behalf of the check node 330) receives values of 1, 0, 1, and 0 from variable nodes 332, 334, 336, and 338, respectively. The decoder 124 processes the received values to determine whether a condition for the check node 330 is satisfied. For example, the decoder may XOR all of the received values. In this case, $1 \oplus 0 \oplus 0 \oplus 0 = 1$, so the check is unsatisfied. Thus, the check node 330 is assigned a value of "U" (for "Unsatisfied"), as shown in FIG. 3C.

Figure 3E:
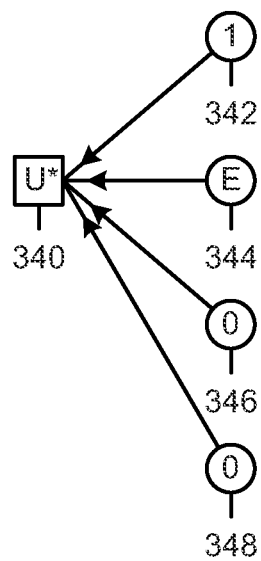
Figure 3F:
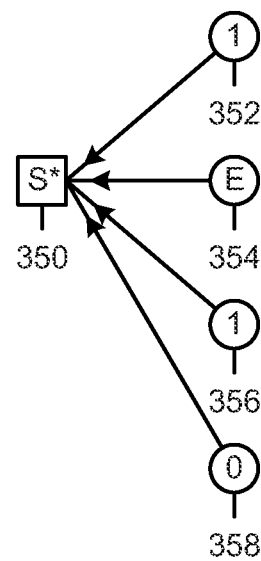

In FIG. 3F, the decoder 124 is determining whether a check node 340 is satisfied. The decoder 124 (acting on behalf of the check node 340) receives values 1, E, 0, and 0 from variable nodes 342, 344, 346, and 348, respectively. In this case, the threshold number of erased variable nodes that trigger an indication of "E" is two. So, in this case, the decoder 124 determines that, having received only one "erased" value, it does have enough information to determine whether a condition for the check node 340 is satisfied. Thus, the decoder 124 processes the non-erased received values to determine whether a condition for the check node 340 is satisfied, for example, by XORing all of the non-erased received values. In this case, $1 \oplus 1 \oplus 0 = 0$, so the check is satisfied. Ignoring the erased value implicitly assumes that the erased value is zero: $1 \oplus 0 \oplus 1 \oplus 0 = 0$. In assigning a value to the check node, the decoder 124 notes that one of the variable nodes 342, 344, 346, or 348 was erased. Thus, the check node 340 is assigned a value of "S*" ("Satisfied with Erasure"), as shown in FIG. 3F.

Similarly, in FIG. 3E, the decoder 124, which is determining whether a check node 350 is satisfied, receives a single "erased" value and three non-erased values. Again, the threshold number of erased variable nodes that trigger an indication of "E" is two. However, in this case, unlike in FIG. 3D, the three non-erased values (1, 0, and 0) do not satisfy the condition of XORing the non-erased values ($1 \oplus 0 \oplus 0 = 1$). Again, ignoring the erased value implicitly assumes that the erased value is zero: $1 \oplus 0 \oplus 0 \oplus 0 = 0$. The check node 350 is assigned a value of "U*" ("Unsatisfied with Erasure"), as shown in FIG. 3e.

In some arrangements, the Satisfied and Satisfied with Erasure conditions (S and S*) are merged, and both are stored as Satisfied (S). This reduces the number of possible indications to four, which simplifies the hardware and consumes less syndrome memory.

All of the rules described in relation to FIGS. 3A through 3F apply to check nodes that receive variable node values from three variable nodes. In other arrangements, the check node indications can be based on more or fewer variable nodes, and the rules can be adjusted accordingly. For example, in some arrangements, the threshold number of erased variable nodes that trigger an indication of "E" is always two, regardless of how many variable nodes each check node receives values from. In other arrangements, the threshold number of erased variable nodes that trigger an indication of "E" is greater than two.

As noted earlier, FIGS. 3G through 3L show graphical illustrations of rules for determining indications at check nodes based on the value of variable nodes having one of four states. In FIGS. 3I and 3L, the decoder 124 is determining whether check nodes 370 and 385 are satisfied. The decoder 124 (acting on behalf of the check nodes 370) receives values W, S, −W, and S from variable nodes 371, 372, 373 and 374, respectively.

The decoder first determines if the check node is satisfied or not. The decoder may XOR all of the received values. In this case, $0 \oplus 1 \oplus 0 \oplus 1 = 1$, so the check is unsatisfied. The check node 370 is assigned a value of u2, as shown in FIG. 3I, which indicates that the check node is unsatisfied, but at least a threshold number of the variable nodes that the check node 370 receives values from are "weak" and not sufficiently reliable. In this case, the threshold number of weak variable nodes that trigger an indication of u2 is two. However, the threshold number of weak variable nodes that trigger an indication of u2 can be different, and can vary from iteration to iteration. Similarly, The decoder 124 (acting on behalf of the check nodes 385) receives values S, −W, S, and −W from variable nodes 386, 387, 388 and 389, respectively. The decoder may XOR all of the received values. In this case, $0 \oplus 1 \oplus 0 \oplus 1 = 0$, so the check is satisfied. The check node 385 is assigned a value of s2, as shown in FIG. 3L, which indicates that the check node is satisfied, but at least a threshold number of the variable nodes that the check node 385 receives values from are "weak" and may not be sufficiently reliable. In this case, the threshold number of weak variable nodes that trigger an indication of s2 is two. However, the threshold number of weak variable nodes that trigger an indication of s2 can be different, and can vary from iteration to iteration.

Similar to check node 300 in FIG. 3A, decoder 124, which may include control circuitry such as a processor, receives data from the variable nodes 371-374 and 386-389, which are stored in hard decision memory. The decoder 124 may determine whether the number of variable nodes 371-374 and 386-389 with a "weak" value is at least a threshold number of erased variable nodes. Upon a determination that the number of variable nodes 371-374 and 386-389 with a "weak" value (two in this case) is at least the threshold (two in this case), the decoder 124 stores an indication of s2 or u2 for the check nodes 370 and 385, respectively, in the syndrome memory. Rules applied when the number of weak variable nodes is less than the threshold are described in relation to FIGS. 3G, 3H, 3J and 3K. Similar methods can be used for applying these rules.

In FIG. 3G, the decoder 124 is determining whether a check node 360 is satisfied. The decoder 124 (acting on behalf of the check node 360) receives values of S, S, −S and S from variable nodes 361, 362, 363 and 364, respectively. The decoder 124 processes the received values to determine whether a condition for the check node 360 is satisfied. For example, the decoder may XOR all of the received values. In this case, 0⊕0⊕1⊕0=1, so the check is unsatisfied. Thus, the check node 360 is assigned a value of "u0", as shown in FIG. 3G. In this case, the number of weak variable nodes that trigger an indication of u0 is zero. However, the number of weak variable nodes that trigger an indication of u0 can be different, and can vary from iteration to iteration.

In FIG. 3J, the decoder 124 is determining whether a check node 375 is satisfied. The decoder 124 (acting on behalf of the check node 375) receives values of S, −S, −S, S from variable nodes 376, 377, 378 and 379, respectively. The decoder 124 processes the received values to determine whether a condition for the check node 375 is satisfied. For example, the decoder may XOR all of the received values. In this case, 0⊕1⊕1⊕0=0, so the check is satisfied. Thus, the check node 375 is assigned a value of "s0", as shown in FIG. 3J. In this case, the number of weak variable nodes that trigger an indication of s0 is zero. However, the threshold number of weak variable nodes that trigger an indication of s0 can be different, and can vary from iteration to iteration.

In FIG. 3H, the decoder 124 is determining whether a check node 365 is satisfied. The decoder 124 (acting on behalf of the check node 365) receives values S, S, W and −S from variable nodes 366, 367, 368 and 369, respectively. For example, the decoder may XOR all of the received values. In this case, 1⊕1⊕1⊕0=1, so the check is unsatisfied. Thus, the check node 365 is assigned a value of "u1" (for "unsatisfied"), as shown in FIG. 3H. In this case, the number of weak variable nodes that trigger an indication of u1 is one. However, the number of weak variable nodes that trigger an indication of u1 can be different, and can vary from iteration to iteration.

Similarly, in FIG. 3K, the decoder 124, which is determining whether a check node 380 is satisfied, receives a single weak value and three strong values. For example, the decoder may XOR all of the received values. In this case, 0⊕0⊕0⊕0=0, so the check is satisfied. Thus, the check node 380 is assigned a value of "s1", as shown in FIG. 3K. In this case, the number of weak variable nodes that trigger an indication of s1 is one. However, the number of weak variable nodes that trigger an indication of s1 can be different, and can vary from iteration to iteration.

In certain arrangements, one or more indications are merged to reduce storage requirements. For example, states s0 (FIG. 3H) and s1 (FIG. 3G) may be merged, and/or states u0 (FIG. 3K) and u1 (FIG. 3J) may be merged.

FIGS. 4A through 4C show graphical illustrations of rules for determining a value of a variable node having one of three states based on indications received from check nodes, in accordance with some arrangements. In FIGS. 4A through 4C, the value of the variable node being considered is E ("erased"), and the rules illustrated in FIGS. 4A through 4C dictate when and how variable nodes are assigned binary values, writing over their initial erased states. For FIGS. 4A, 4B, and 4C, the threshold number of matching non-E indications from check nodes needed to assign the variable node to a non-erased state is two.

In FIG. 4A, the decoder 124 (acting on behalf of the variable node 406) receives check node indications of E, S*, and E from variable nodes 400, 402, and 404, respectively. The decoder 124 processes the received values to determine whether the variable node 406 can be assigned to a binary state. In this case, the threshold number of check nodes to assign (two) has not been reached, so the variable node 406 is again assigned the erased state, E.

In FIG. 4B, the decoder 124 (acting on behalf of the variable node 416) receives check node indications of S*, S*, and E from variable nodes 410, 412, and 414, respectively. In arrangements where S and S* are merged, rather than originally indicating S*, the check nodes 410 and 412 would indicate S. The decoder 124 processes the received values to determine whether the variable node 416 can be assigned to a binary state. In this case, since two of the check nodes indicate that they are Satisfied with Erasure, the threshold number of matching non-E check nodes to assign (2) has been reached. So, the variable node 416 is assigned a value of 0. As described in relation to FIG. 3E, a check node indicating Satisfied with Erasure (S*) assumes that the value of the erased variable node is 0. Now that the erased variable node is assigned a 0, on the next check iteration, the indication of the check nodes 410 and 412 will become Satisfied (S).

In FIG. 4C, the decoder 124 (acting on behalf of the variable node 426) receives check node indications of U*, U*, and E from variable nodes 420, 422, and 424, respectively. The decoder 124 processes the received values to determine whether the variable node 426 can be assigned to a binary state. In this case, since two of the check nodes indicate that they are Unsatisfied with Erasure, the threshold number of matching non-E check nodes to assign (2) has been reached. So, the variable node 426 is assigned a value of 1. As described in relation to FIG. 3F, a check node indicating Unsatisfied with Erasure (U*) assumes that the value of the erased variable node is 0. With the erased variable node actually being assigned to 1, the check will no longer be unsatisfied. So, on the next check iteration, the indication of the check nodes 420 and 422 will become Satisfied (S).

FIGS. 5A and 5B show graphical illustrations of rules for toggling the value of a variable node based on indications received from check nodes, in accordance with some arrangements. In FIGS. 5A and 5B, the value of the variable node being considered is a binary value (0 or 1), and the rules illustrated in FIGS. 5A and 5B dictate when a binary of a variable node is toggled or flipped to the other binary value. For FIGS. 5A and 5B, the threshold number of unsatisfied indications from check nodes needed to toggle the variable node is two.

In FIG. 5A, the decoder 124 (acting on behalf of the variable node 506) receives two check node indications of U from check nodes 502 and 504, and any non-U indication (E, S, S*, or U) from check node 500. The decoder 124 processes the received values to determine whether the variable node 506 should be toggled or flipped from 1 to 0. In this case, the threshold number of unsatisfied (U) check nodes to toggle (2) has been reached, so the variable node 506 is toggled to 0.

Similarly, in FIG. 5B, the same check node indications are received (i.e., two unsatisfied indications), but the variable node 516 was originally set to 0. In this case, the value of the variable node 516 is toggled to 1.

For toggling or flipping variable nodes from one binary value to the other, the decoder 124 distinguishes between Unsatisfied (U) and Unsatisfied with Erasure (U*). So, if a variable node receives a single indication of U and one or even two indications of U*, the variable node is not toggled.

In some arrangements, the threshold to assign, the threshold to toggle, or both thresholds may vary between iterations of the decoding process. In some arrangements, the threshold to assign or the threshold to toggle is based on a probability of a particular binary value or another factor specific to a variable node.

The rules described in relation to FIGS. 4A, 4B, 4C, 5A, and 5B applied to variable nodes that receive indications from three check nodes. In other arrangements, the variable nodes receive indications from more or fewer check nodes. The thresholds can be adjusted according to the number of check nodes from which indications are received.

Figure 6A:
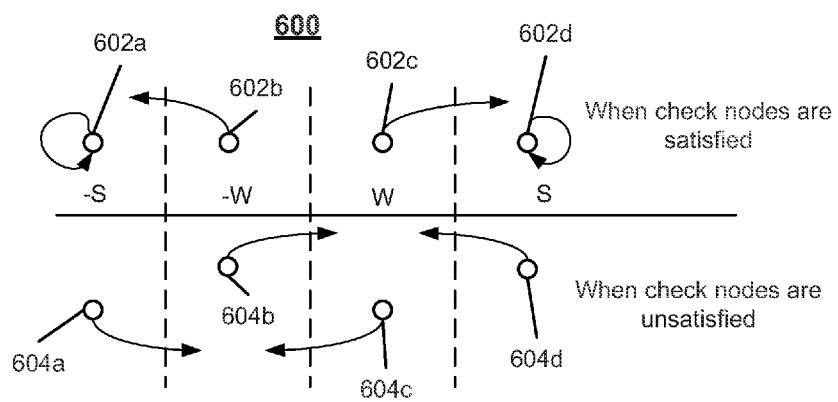
FIG. 6A shows a graphical illustration of maintaining or changing the state or value of a variable node having one of four states, based on indications received from check nodes.
Figure 6B:
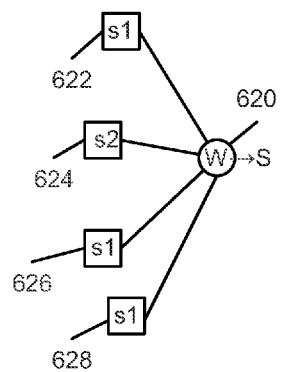
FIGS. 6B and 6C show graphical illustrations of rules when maintaining and changing, respectively, the state of a variable node having one of four states, based on indications received from check nodes in accordance with some arrangements.
Figure 6C:
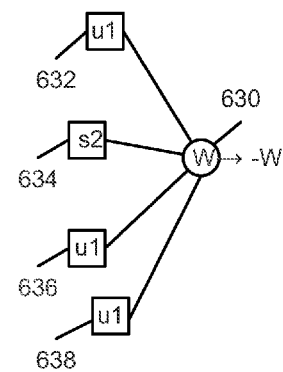

FIGS. 6A through 6C show graphical illustrations of determining the value of a variable node having one of four estates, based on indications received from check nodes. Generally, the values at variable nodes may be any suitable function of the value of neighboring check nodes and the value at the respective variable nodes in a previous iteration:

$$S_i(v)=g^i(S_i(N(v)),S_{i-1}(v))$$

Where $S_i(v)$ are values at variable nodes after the $i^{th}$ iteration of the decoding algorithm, $S_i(N(v))$ is the indication of the neighboring check nodes at the $(i)^{th}$ iteration, $S_{i-1}(v)$ are values at variable nodes after the $(i-1)^{th}$ iteration, and $g_i$ is the respective function at the $i^{th}$ iteration. In certain embodiment, the function g is constant across all iterations. In other embodiments, the function g varies across one or more iterations.

FIG. 6A shows an overall state diagram depicting the direction and extent of change variable node may undergo based on the indications of one or more check nodes. As shown in FIG. 6A, the value of the variable node being considered is a binary value (0 or 1) with a reliability bit indicating whether the value is strong in terms of reliability or weak in terms of reliability. Accordingly, the variable node have values of S (binary value of 0 with high confidence), W (binary value of 0 with low confidence), -W (binary value of 1 with low confidence) and -S (binary value of 1 with high confidence). When, at a variable node, a threshold number of unsatisfied indications from connected check nodes needed to toggle the variable node is reached, then the check nodes are generally considered to be unsatisfied. As a consequence, the value of the variable node transitions from one value to another. As shown in FIG. 6A, when the check nodes are generally considered to be unsatisfied, variable node 604a which has a value of -S may transition to a value of -W. Similarly, variable node 604b may transition from -W to W. Variable node 604c may transition from W to -W, and variable node 604d may transition from S to W.

In certain arrangements, at a variable node, a threshold number of satisfied indications from connected check nodes is reached. In such an arrangement, the check nodes may be considered to be generally satisfied. As a consequence, the value of variable nodes either remains the same if it was reliable to begin with, or the reliability of the variable node may be adjusted to increase in confidence. As shown in FIG. 6A, when the check nodes are generally considered to be satisfied, variable nodes 602a and 602d remain the same state, namely -S and S, respectively. However, variable node 602b transitions from -W to -S because the check nodes have indicated that a binary value of 1 (corresponding to the sign bit) is satisfactory. Similarly, variable node 602c transitions from W to S because the check nodes have indicated that a binary value of 0 (corresponding to the sign bit) is satisfactory. The transitions described above may happen during each iteration with the goal of transitioning the values of all or substantially all variable nodes towards -S or S, i.e., binary values with high confidence.

FIGS. 6B and 6C show graphical illustrations of exemplary rules when maintaining and changing, respectively, the state of a variable node having one of four states, based on indications received from check node. In particular, FIG. 6B shows a rule for maintaining, and maybe strengthening, the state of a variable node from W to S.

In FIG. 6B, the decoder 124 (acting on behalf of the variable node 620) receives check node indications of s1, s2, s1 and s1 from variable nodes 622, 624, 626 and 628 respectively. The decoder 124 processes the received values to determine whether the variable node 620 should be toggled or strengthened. In this case, three of the check nodes (622, 626 and 628) indicate s1, which could mean that for each of those check nodes, all but one neighboring variable nodes are weak and the check is satisfied. Therefore, by process of elimination, the weak variable node is node 620. The one check node 624 indicating s2 may be considered, without harm, because even though at least two neighboring nodes are weak, the check is still satisfied. If check node 624 had indicated u2, it may still be safely ignored in this iteration, because even though the check would have been unsatisfied, at least two neighboring nodes are weak and therefore it could be another variable node, and not node 620, that needs toggling. Thus, because node 620 is weak, but does not require toggling, the value of node 620 is transitioned from W to S.

In FIG. 6C, the decoder 124 (acting on behalf of the variable node 630) receives check node indications of u1, s2, u1 and u1 from variable nodes 632, 634, 636 and 638 respectively. The decoder 124 processes the received values to determine whether the variable node 620 should be toggled or strengthened. In this case, three of the check nodes (632, 636 and 638) indicate u1, which could mean that for each of those check nodes, all but one neighboring variable nodes are weak and the check is unsatisfied. Therefore, by process of elimination, the weak variable node connected to the respective check nodes is node 630. Node 634 having an indication of s2 may be safely ignored in this iteration, because even though the check would have been satisfied, at least two neighboring nodes are weak and therefore it could be another variable node, and not node 630, that needs to remain unchanged. Thus, because node 630 requires toggling, the value of node 620 is transitioned from W to -W in this iteration. In a subsequent iteration, it may be possible that node 630 receives further confirmation from the check nodes about its value. In such an instance, node 630 may then transition from -W to -S.

In certain arrangements, the rules for transitioning the variable nodes from one value another may be based on the number of check nodes in a state including at least one of u0, u1, u2, s0, s1, and s2. In one example, during the first iteration, if the number of nodes in state u0 or u1 is equal to 3, then the decoder 124 may toggle the value of the variable node. In another example, during the first iteration, if the number of nodes in states s2 plus the number of nodes in at least one of s0 and s1 is equal to 0, then the decoder 124 may toggle the value of the variable node. In another example, during the first iteration, if the number of nodes in state u0 or u1 is equal to 2, and number of nodes in state u2 is equal to 1, and the number of nodes in state s2 is equal to 1, then the decoder 124 may toggle the value of the variable node. In still another example, during the first iteration, if the number of nodes in state u0 or u1 is equal to 1, and the number of nodes in state u2 is equal to 2, and the number of nodes in state s2 is equal to 1, then the decoder 124 may toggle the value of the variable node.

In certain arrangements the rules for transitioning values of variable nodes may be the same or different for different iterations. For example, during a later iteration, if the number of nodes in state s2 plus the number of nodes in at least one of s0 and s1 is less than or equal to 1, then the decoder 124 may toggle the value of the variable node. In another example, during a later iteration, if the number of nodes in state u0 or u1 is greater than zero, and the number of nodes in state s0 or s1 is equal to zero and the number of nodes in state s2 is equal to zero, then the decoder 124 may toggle the value of the variable node. In still another example, during a later iteration, if the number of nodes in state s0 or s1 is equal to 1, and the number of nodes in u0 or u1 is equal to 2, and the number of nodes in state s2 is equal to 1, then the decoder 124 may toggle the value of the variable node. Generally, the rules for whether or not to transition a value of a variable node may be based on at least one of the number of check nodes having any particular state as desired, and the number of iterations.

Figure 7:
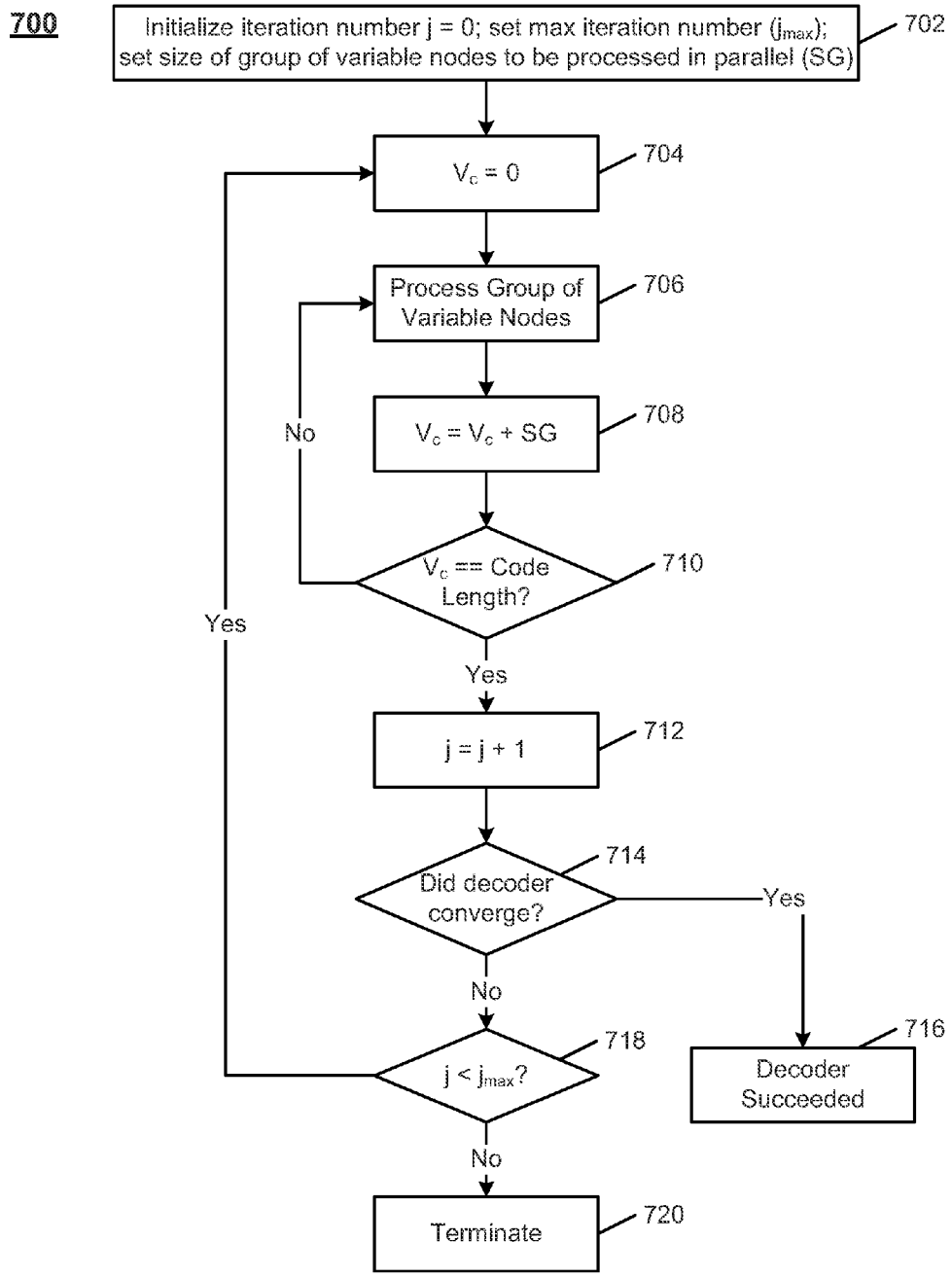
FIG. 7 shows a flow chart for an method of decoding a codeword with three-state input in accordance with some arrangements.

FIG. 7 shows a flow chart for a method 700 of decoding a codeword with three-state input according to some arrangements. At 702, the decoder 124 initializes the decoding process. The initialization involves initializing the iteration number j to 0 and setting the maximum number of iterations ($j_{max}$). The maximum iterations $j_{max}$ is the most number of iterations of updating the variable node values and setting the check node indications that can be performed before the decoding process is automatically ended, even if the decoder did not determine the codeword. Variable nodes are processed in a certain order (e.g., natural order), but multiple variable nodes can be processed in parallel to increase decoding speed. So, at initialization, the decoder 124 also sets a group size of variable nodes to be processed in parallel (SG).

At 704, the decoder 124 initializes a loop counter $V_c$ for keeping track of the number of variable nodes that have been processed and sets $V_c$ to zero. At 706, the decoder 124 processes a group of variable nodes of size SG in parallel. For each variable node, the processing involves polling certain check nodes to determine if the value of the variable node should be updated, and updating the check node indications based on updates to the variable nodes. The processing is described in further detail in relation to FIG. 8.

At 706, after the group of variable nodes has been processed, the decoder 124 adds the number of variable nodes in the group that was just processed (SG) to the loop counter $V_c$. At 710, the decoder 124 determines whether $V_c$ equals the length of the codeword. If $V_c$ does not equal the length of the codeword, the method loops back to 706, at which the next group of variable nodes is processed. If $V_c$ equals the length of the codeword, at 712, the decoder 124 increments the iteration number j by one.

At 714, the decoder 124 determines whether or not the decoder 124 has converged. This means that the decoder 124 has assigned a binary value to all variable nodes and that the conditions of all of the check nodes are satisfied. In some arrangements, conditions for convergence are relaxed, and a minimum amount of error (e.g., a minimum amount of erased variable nodes or a minimum amount of unsatisfied check nodes) is permitted. If the decoder converged, at 716, it is determined that the decoder succeeded. The decoder 124 then outputs the decoded message 128 to the receiving user or application 130.

At 718, if the decoder 124 did not converge, the decoder 124 determines whether the iteration number j is less than the maximum number of iterations $j_{max}$. If the iteration number j is less than the maximum number of iterations $j_{max}$, the method loops back to 704, where the loop counter $V_c$ is reset to zero and the variable nodes are processed again. If the iteration number j is not less than the maximum number of iterations $j_{max}$, at 720, the method terminates. In some arrangements, after terminating, the decoder 124 outputs the result of the decoding to the receiving user or application 130. In some arrangements, the decoder 124 or the receiving user or application 130 requests that the transmitting user or application 102 retransmit the codeword 110. The decision of whether to accept the message or request the message be resent may be based on the degree to which the decoder 124 determines that the decoded message 128 is incorrect.

Figure 8:
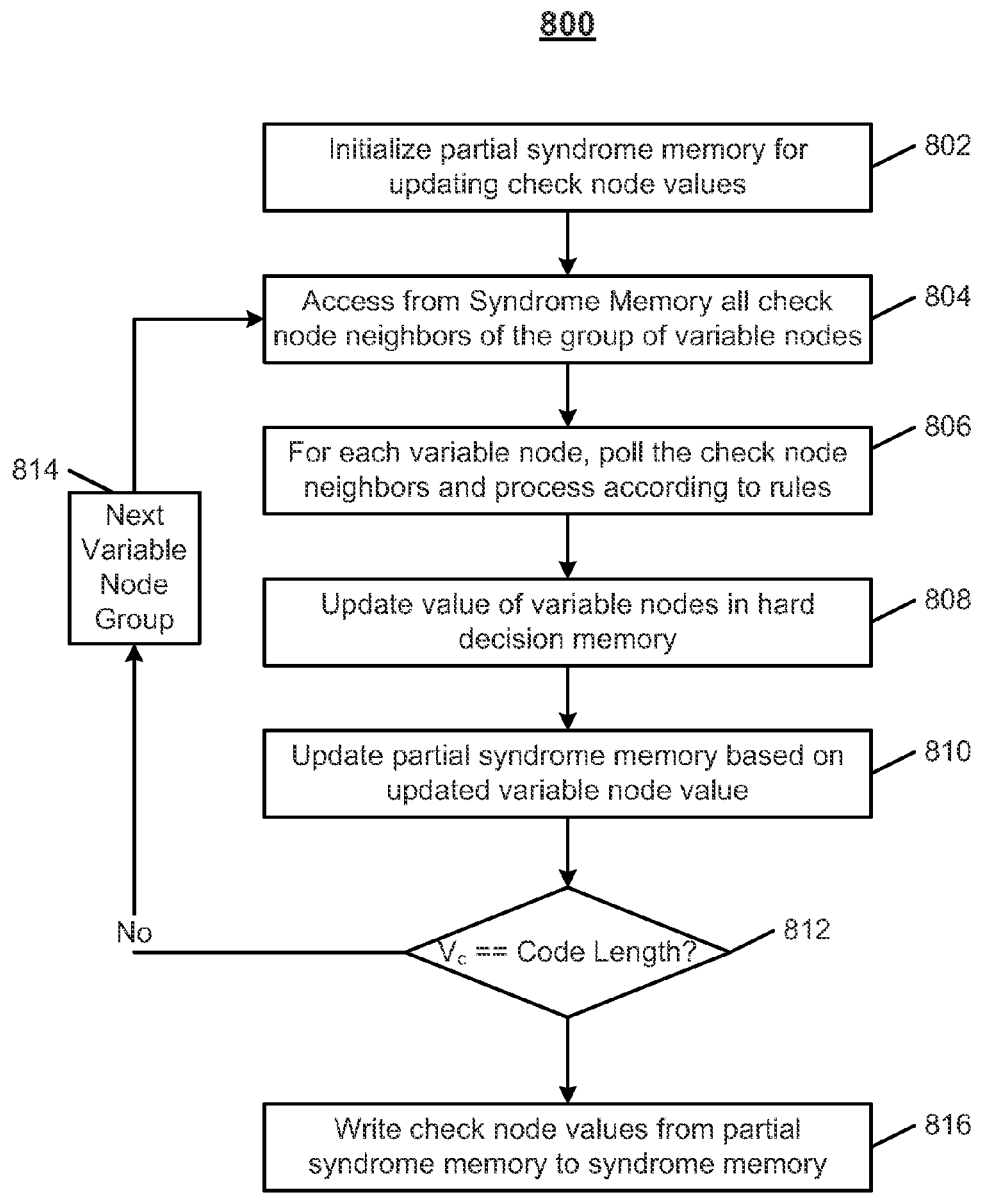
FIG. 8 shows a flow chart for an method of processing variable nodes in accordance with some arrangements.

FIG. 8 shows a flow chart for a method of processing variable nodes in accordance with some arrangements. This method is used in 706 of FIG. 7. At 802, the decoder 124 initializes a partial syndrome memory in which the check node values are updated. As the decoder 124 updates the variable nodes, it accesses the syndrome memory from the previous iteration and creates an updated version of the check nodes in the partial syndrome memory, as will be described further below. At 804, for a particular group of variable nodes, the decoder 124 accesses from syndrome memory the check node neighbors for the group of variable nodes. So, for example, if a group consists of three variable nodes, each of which is checked by four check nodes, the decoder will access twelve check nodes. In some arrangements, two or three of the variable nodes are checked by the same check node; in this case, that check node only has to be accessed one time, and fewer than twelve check nodes are accessed.

At 806, for each variable node in the group of variable nodes, the decoder 124 polls the check nodes that check that variable node. The indications of the check nodes are processed according to the rules described in relation to FIGS. 4A through 6C. At 808, based on the processing of the check node indications, the decoder 124 updates the value of the variable nodes in the hard decision memory. In 806 and 808, the variable nodes in the group of variable nodes may be processed in parallel or in series. At 810, based on the updated variable node values, the decoder 124 updates the partial syndrome memory based on the updated variable node values. For example, if a particular check node checks one of the variable nodes in the group, the new value of the variable node (which may be the same as the previous value) is XORed with the present value of the check node in the partial syndrome memory. In addition, the partial syndrome memory may have a counter for "erased" variable nodes; once this counter reaches the threshold of erased variable nodes, the check node in partial syndrome memory is set to E.

At 812, which is the same as 710, the decoder 124 determines whether $V_c$ equals the length of the codeword. If $V_c$ does not equal the length of the codeword, the method loops back to 804, which is the first element of 706 from FIG. 7, and the next group of variable nodes is processed. If $V_c$ equals the length of the codeword, at 816, the decoder 124 writes the check node values from the partial syndrome memory to the syndrome memory, thus overwriting the previous check node values stored in the syndrome memory. In FIG. 7, after 816 has been completed, the method continues to 712.

The above described arrangements and embodiments are presented for the purposes of illustration and not of limitation. One or more parts of techniques described above may be performed in a different order (or concurrently) and still achieve desirable results. In addition, the techniques of the disclosure may be implemented in hardware, such as by an application specific integrated circuit (ASIC) or by a field-programmable gate array (FPGA). The techniques of the disclosure may also be implemented in software, or in a combination of hardware and software.

What is claimed is:

1. A method for decoding data, comprising:
   providing decoder circuitry in communication with a plurality of variable nodes and a plurality of check nodes, wherein each of the variable nodes is connected to the plurality of check nodes, and each of the check nodes is connected to the plurality of variable nodes;
   receiving, at the decoder circuitry during a first iteration, a value for each of the plurality of variable nodes;
   determining, at the decoder circuitry during a second iteration, an indication for each of the plurality of check nodes based on the value received during the first iteration by connected variable nodes; and
   updating, at the decoder circuitry during the second iteration, the value of each of the variable nodes based on the value received during the first iteration, by the respective variable node and the value received during the first iteration by each of the plurality of connected check nodes;

wherein the value of each of the plurality of variable nodes is selected from a group consisting of at least four values, and wherein the indication for each of the plurality of check nodes is selected from a group consisting of at least five indications.

2. The method of claim 1, further comprising determining, at the decoder circuitry during a third iteration, the indication for each of the plurality of check nodes based on the value received during the second iteration by the connected variable nodes.

3. The method of claim 2, further comprising updating, at the decoder circuitry during the third iteration, the value for each of the variable nodes based on the value of the respective variable node received during the second iteration, and the indication received during the second iteration for each of the plurality connected check nodes.

4. The method of claim 1, further comprising repeating the operation of determining an indication for each of the plurality of check nodes, and updating the value of each of the variable nodes until a completion condition is reached.

5. The method of claim 4, wherein the completion condition includes a predetermined number of repetitions.

6. The method of claim 4, wherein the completion condition includes a determination that a threshold number of indication for the plurality of check nodes are satisfied.

7. The method of claim 4, wherein the completion condition is based on at least one of the indications for the plurality of check nodes.

8. The method of claim 1, wherein the variable nodes include a sign bit and a reliability bit, and determining an indication for each of the plurality of check nodes is based on a value of the sign bit and the reliability bit.

9. The method of claim 8, wherein the indication for each of the plurality of check nodes includes an XOR of the sign bit of each the connected variable nodes.

10. The method of claim 8, wherein the indication for each of the plurality of check nodes includes a determination of reliability of the connected variable nodes based on a respective reliability bit.

11. The method of claim 1, wherein the value of each of the plurality of variable nodes is a two bit value and is selected from a group consisting of 00, 01, 10, 11, wherein at least one of the first bit and second bit is a sign bit representative of the data being decoded and the other bit is a reliability bit representative of the reliability of the data being decoded.

12. The method of claim 1, wherein the indication of each of the plurality of check nodes includes one or more satisfactory indications, representative of support for the value of the variable nodes during the first iteration.

13. The method of claim 12, wherein the operation of updating is based on the number of satisfactory indications.

14. The method of claim 1, wherein the indication of each of the plurality of check nodes includes one or more unsatisfactory indications, representative of support against the value of the variable nodes during the first iteration.

15. The method of claim 14, wherein the operation of updating is based on the number of unsatisfactory indications.

16. The method of claim 1, wherein the operation of updating includes setting the value for each of the variable nodes during the second iteration equal to the value for each of the variable nodes during the first iteration.

17. A method for decoding data, the method comprising:
receiving, at a detector, a block of encoded data having a plurality of binary symbols;
converting, at the detector, each of the plurality of binary symbols to a nonbinary value selected from a group consisting of at least four values;
assigning, at a decoder, each nonbinary value to a variable node, wherein the decoder includes a plurality of variable nodes and each variable node correspond to each of the plurality of binary symbols;
determining, at the decoder, an indication for a check node, wherein the decoder includes a plurality of check nodes, each check node connected to the plurality of variable nodes, and each variable node connected to the plurality of check nodes, and wherein each indication is based on the nonbinary values of the connected variable nodes;
iteratively updating, at the decoder, each nonbinary value of the variable node based on the indications previously determined at the connected check nodes; and
determining, at the decoder, a block of decoded data based on the updated nonbinary values.

18. A system for decoding data, the system comprising:
a detector, having circuitry for receiving a block of encoded data having a plurality of binary symbols and converting each of the plurality of binary symbols to a nonbinary value selected from a group consisting of at least four values; and
a decoder, having circuitry for:
assigning each nonbinary value to a variable node,
determining an indication for a check node, wherein the decoder includes a plurality of check nodes connected to the plurality of variable nodes, and wherein the indication is based on the nonbinary values of the connected variable nodes,
iteratively updating each nonbinary value of the variable node based on the indications previously determined at the connected check nodes, and
determining a block of decoded data based on the updated nonbinary values.

19. The system of claim 18, wherein the decoder includes circuitry for repeating the operation of determining an indication for each check node, and updating the nonbinary value of each of the variable nodes until a completion condition is reached.

20. The system of claim 18, wherein each nonbinary value is represented by a two bit value and is selected from a group consisting of 00, 01, 10, 11, wherein at least one of the first bit and second bit is a sign bit representative of the data being decoded and the other bit is a reliability bit representative of the reliability of the data being decoded.

* * * * *